United States Patent [19]
Shi et al.

[11] Patent Number: 6,130,001
[45] Date of Patent: *Oct. 10, 2000

[54] ORGANIC ELECTROLUMINESCENT DEVICE WITH CONTINUOUS ORGANIC MEDIUM

[75] Inventors: Song Q. Shi, Phoenix; Franky So, Tempe, both of Ariz.; Hsing-Chung Lee, Calabasas, Calif.; Cynthia Gorsuch Briscoe, Tempe, Ariz.

[73] Assignee: Motorola, Inc., Schaumburg, Ill.

[ * ] Notice: This patent is subject to a terminal disclaimer.

[21] Appl. No.: 08/893,116

[22] Filed: Jul. 15, 1997

[51] Int. Cl.$^7$ .................................................. H05B 33/14
[52] U.S. Cl. ........................... 428/690; 428/917; 313/504
[58] Field of Search ..................................... 313/504, 509; 422/690, 691, 917

[56] References Cited

U.S. PATENT DOCUMENTS

| | | | |
|---|---|---|---|
| 5,540,999 | 7/1996 | Yamamoto et al. | 428/411.1 |
| 5,767,624 | 6/1998 | Gordon, II et al. | 313/358 |
| 5,804,322 | 9/1998 | Shi et al. | 428/690 |
| 5,925,980 | 7/1999 | So et al. | 313/504 |

OTHER PUBLICATIONS

Chen et al. "Recent Develop. in Mol. Org. EL Mat." Macromol. Symp. 124, pp. 1,6, (1997) (no month).

*Primary Examiner*—Marie Yaminitzky
*Attorney, Agent, or Firm*—Eugene A. Parsons; William E. Koch

[57] ABSTRACT

An organic EL device includes a cathode, an organic electroluminescent layer and an anode, laminated in sequence. The organic layer is composed of a continuous organic medium $A_xB_y$, where A and B are components capable of transporting electrons and holes, respectively, x represents the content of the A component with a value ranging from 0 adjacent the anode to 100% adjacent the cathode, and y represents the content of the B component with a value ranging from 0 adjacent the cathode to 100% adjacent the anode. The lifetime of the device is improved by the elimination of heterojunctions in the continuous organic medium and suppression of the re-crystallization tendency of the organic materials. At least one fluorescent dye or pigment is incorporated in the organic layer to improve efficiency and color of the luminescence.

19 Claims, 1 Drawing Sheet

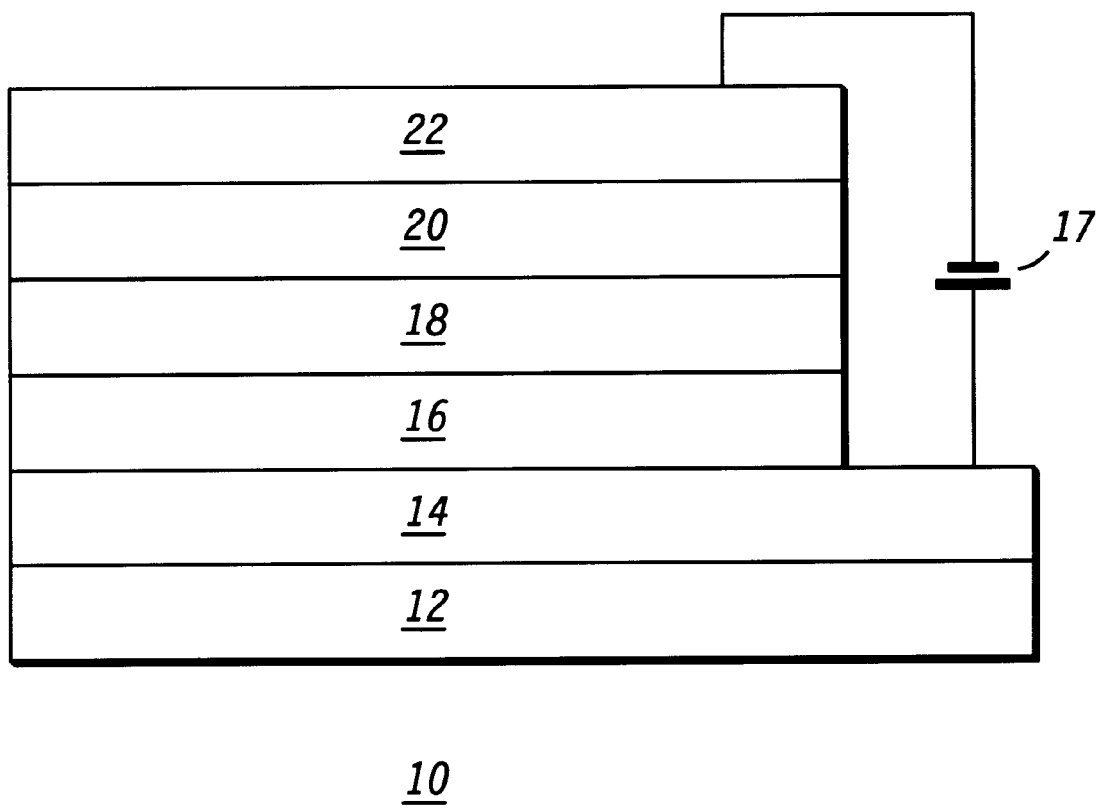

ORGANIC ELECTROLUMINESCENT DEVICE WITH CONTINUOUS ORGANIC MEDIUM

FIELD OF THE INVENTION

This invention relates to an organic electroluminescent (EL) device and more specifically to, the organic medium in the organic EL device.

BACKGROUND OF THE INVENTION

Organic electroluminescent (EL) devices are generally composed of three layers of organic materials sandwiched between transparent and metallic electrodes, the three layers including an electron transporting layer, an emissive layer and a hole transporting layer. Organic EL devices are attractive owing to the requirement for low driving voltage and the potential application to full color flat emissive displays. Though significant lifetime has been achieved in the prior art (See U.S. Pat. No. 4,720,432), further improvement is needed for applications where high brightness is required. Among other things, the lifetime of an organic EL device is affected by the stability of both the bulk morphology of the hole transporting materials and the interface between the hole and electron transporting layers when the organic EL device is under bias.

Several schemes have been proposed to address the problem of bulk morphology stability of the hole transporting materials in an organic EL device: one being a double-layer hole transporting configuration (see U.S. Pat. No. 5,256,945); and another being usage of materials of high glass transition temperatures (U.S. Pat. No. 5,061,569).

It is a purpose of this invention to address the problem of the interface stability between heterojunctions in an organic EL device.

It is another purpose of this invention to provide a new method to enhance the thermal stability of the organic electroluminescent medium of an organic EL device.

It is a further purpose of this invention to provide an organic electroluminescent device for displays with improved reliability.

SUMMARY OF THE INVENTION

The above problems and others are at least partially solved and the above purposes and others are realized in an organic EL device including a cathode, an organic electroluminescent layer and an anode, laminated in sequence, wherein said organic electroluminescent layer is composed of a continuous organic medium without heterojunctions.

According to the present invention, there is obtained an organic EL device with an improved reliability by eliminating the heterojunctions, and suppressing the aggregation or re-crystallization tendency of organic materials with the formation of a single layer of an organic alloy.

BRIEF DESCRIPTION OF THE DRAWING

The single FIGURE is a simplified sectional view of an organic electroluminescent device in accordance with the present invention.

DESCRIPTION OF THE PREFERRED EMBODIMENT

While the specification concludes with claims defining the features of the invention that are regarded as novel, it is believed that the invention will be better understood from a consideration of the following description in conjunction with the single drawing FIGURE.

Referring now to single FIG. 1, there is illustrated an organic electroluminescent device 10 in accordance with the present invention. Device 10 is fabricated upon a first substrate 12 which is transparent and may be fabricated of any of the number of known materials employed in the art. For example, substrate 12 may be fabricated of a glass, such as a Corning 7059 glass, transparent plastic substrates made of polyolefins, polyethersulfones, polyarylates. In one preferred embodiment, substrate 12 is fabricated of glass of quality good for flat panel display applications.

Deposited atop substrate 12 is a first electrode 14, which is electrically conductive and optically transparent or semi-transparent. Several materials may be advantageously employed as first electrode 14 for an OED device. Examples of materials include conductive metal oxides such as indium oxide, indium-tin oxide (ITO), zinc oxide, zinc-tin oxide, conductive transparent polymers such as polyaniline. Alternatively, electrode 14 may be fabricated of a semi-transparent metal, examples of which include a thin layer (<500 Å) of gold, copper, silver, and combinations thereof. In one preferred embodiment, electrode 14 is fabricated of ITO or zinc oxide.

Thereafter, atop the first electrode 14 is deposited a layer 16 of what is known as the hole injecting material that also acts as a buffer layer to match the thermal and mechanical properties of the first electrode and the subsequent layers of organic materials. Hole injecting layer 16 is preferably comprised of a porphyrinic compound of the type disclosed by Adler in U.S. Pat. No. 3,935,031 or Tang in U.S. Pat. No. 4,356,429. Examples of the preferred compounds include copper phthalocyanine, zinc phthalocyanine. Alternative hole injecting materials such as carbon or carbon nitride films can also be used. It is to be understood that hole injecting layer 16 is optional, and need not necessarily be provided.

Thereafter deposited atop hole injecting layer 16 (if present) is an organic electroluminescent medium layer 18 where light emission takes place. The composition of organic electroluminescent medium layer 18 is one of the key subjects of the present invention and will be described in greater detail herein below.

Thereafter deposited atop organic electroluminescent medium layer 18 is an electron injecting layer 20. Electron injecting layer 20 is used to facilitate the injection of electrons from a cathode (yet to be formed on top of layer 20) to organic electroluminescent medium layer 18. In general, electron injection layer 20 is entirely optional, and may be omitted without significant compromise of the device performance.

Deposited atop electron injecting layer 20 (if present) is a second electrode 22 (cathode) which is typically formed of a metal with a work function of less than 4 eV and at least one other protective metal of higher work function. The preferred low work function metal is selected from a group of lithium, magnesium, calcium, or strontium, while the preferred high work function metal is selected from a group of aluminum, indium, copper, gold, or silver. Second electrode 22 can also be formed of an alloy of a lower work function metal and a high work function metal by coevaporation. The content of the low work function metal in the second electrode can vary from 0.1% to 50%, but preferably below 20%. Alternatively, second electrode 22 can be a metal of work function of greater than 4 eV such as aluminum, silver etc. when electron injection layer 20 is composed of alkaline fluoride such as LiF, $MgF_2$ or alkaline oxide such as $LiO_x$, $MgO_x$, $CaO_x$, $CsO_x$.

Throughout this disclosure, because both layers 16 and 20 are optional, these layers will be considered as a portion of the anode and cathode, respectively. Thus, in this described embodiment of an organic EL device in accordance with the present invention an anode including layers 14 and 16, a single organic electroluminescent layer 18 and a cathode including layers 20 and 22 are laminated in sequence on substrate 12. Also, while the preferred embodiment includes a transparent substrate and anode, it will be understood by those skilled in the art that the entire structure could be reversed so that the light is emitted upwardly in FIG. 1 and the substrate could then be an opaque material.

When a potential is applied between first and second electrodes 14 and 22 by means of a potential source 17, holes are injected from first electrode 14 and hole injecting layer 16 (if present) and electrons are injected from second electrode 22 and electron injecting layer 20 (if present) into organic electroluminescent medium layer 18, wherein upon an electron and a hole recombination a photon is emitted.

The instant disclosure is directed to the organic electroluminescent medium in layer 18. In this embodiment, the organic electroluminescent medium (layer 18) is composed of a continuous organic medium without heterojunctions. The continuous organic medium has a general formula of $A_xB_y$, where A is a component capable of transporting electrons, B is a component capable of transporting holes, x represents the content of the A component in the $A_xB_y$ medium with a value ranging from 0 adjacent the anode to 100% adjacent the cathode, and y represents the content of the B component in the $A_xB_y$ medium with a value ranging from 0 adjacent the cathode to 100% adjacent the anode. The relationship between x and y is: x=100%−y. While the variations of X and Y across layer 18 will generally be substantially linear, it will be understood by those skilled in the art that variations other than linear may be incorporated in specific applications.

In this embodiment, it is preferred that in the direction from the anode to the cathode in the $A_xB_y$ medium (layer 18) the content of the A component (x) gradually increases while the content of the B component (y) gradually decreases. One extreme case will be that the content of the A component increases from 0% to 100%, meantime the content of the B component decreases from 100% to 0% in the direction from layer 16 to layer 20. Of course, it is also possible to start $A_xB_y$ with x being a fraction of a percent (e.g. x=0.1%, y=99.9%) and end up with y being a fraction of a percent (e.g. x=99.9%, y=0.1%). The rates of increase of the A component and decrease of the B component can be controlled by relative evaporation or sputtering rates of the A and B components.

Though component A in the $A_xB_y$ medium can be any one of the electron transporting materials known to those skilled in the art, it is preferred to be selected from the group of organometallic complexes disclosed in U.S. Pat. Nos. 4,769,292 and 5,529,853, and in a pending U.S. patent application entitled "NEW ORGANOMETALLIC COMPLEXES FOR USE IN LIGHT EMITTING DEVICES", filed Sep. 12, 1994, bearing Ser. No. 08/304,451, (now abandoned) and assigned to the same assignee. Characteristics of an appropriate electron transporting material (A) in accordance with the present invention include tris(8-quinolinol) aluminum, bis(10-oxo-benzo[h] quinoline beryllium, bis(2-(2-oxy-phenyl)benzoxazole) zinc, bis(2-(2-oxy-phenyl) benzothiazole) zinc, Bis(2-methyl-8-quinolinolato) aluminum-$\mu$-oxo-bis(2-methyl-8-quinolinolato)aluminum, Bis (2-methyl-8-quinolinolato)(ortho-cresolato)aluminum, or a combination of the above materials.

The hole transporting component B includes organic tertiary aromatic amines having a general structure of

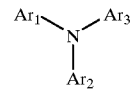

where: $Ar_1$, $Ar_2$ and $Ar_3$ are independently aromatic hydrocarbons or aromatic tertiary amine moieties. The aromatic hydrocarbons and the aromatic tertiary amine moieties in turn can be substituted. Typical substituents includes alkyl groups, alkoxy groups, alkylamine groups, aryl groups, aryloxy groups, arylamine groups and halogen such as bromide, chloride, and fluoride.

The following is a partial list of a few classes of aromatic tertiary amines satisfying the requirement of the present invention for the component B:

Class-1

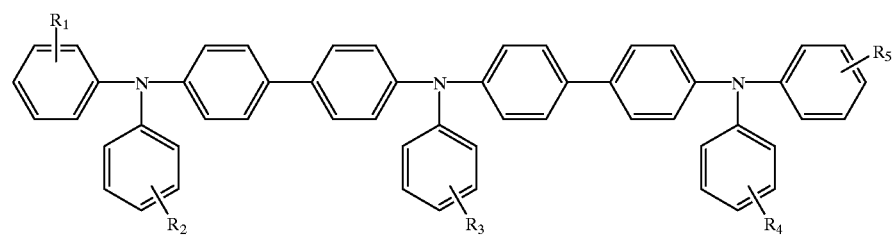

-continued
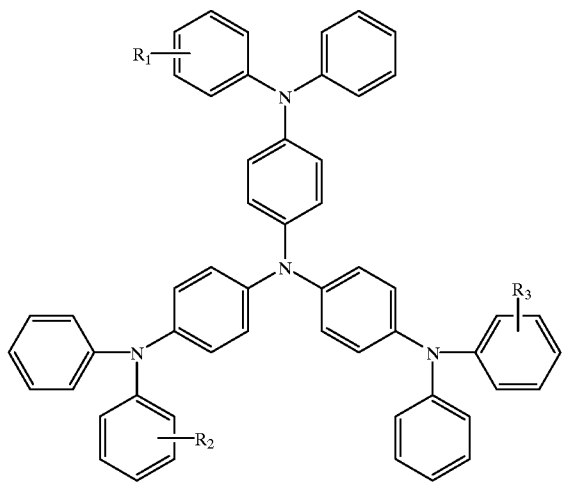
Class-2
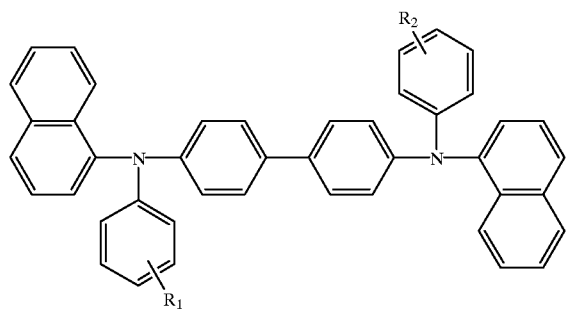
Class-3
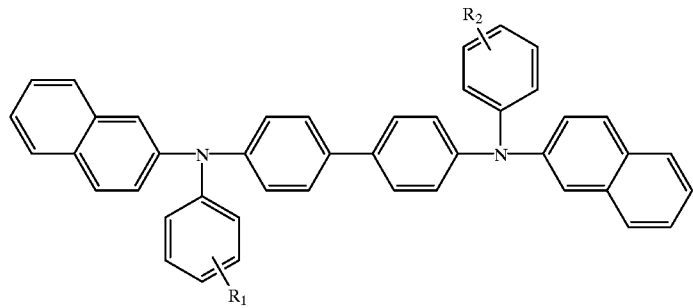
Class-4
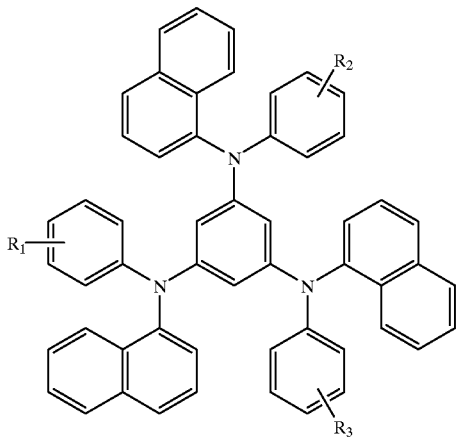
Class-5

Where $R_1$, $R_2$, $R_3$, $R_4$ and $R_5$ are independently selected from alkyl groups, alkoxy groups, alkylamine groups, aryl groups, aryloxy groups, arylamine groups and halogen such as bromide, chloride, and fluoride; and $R_1$, $R_2$, $R_3$, $R_4$ and $R_5$ may also be independently a fused aromatic ring.

Though at the present time, the most reliable organic EL devices are fabricated mainly with the previously discussed aromatic tertiary amines as hole transporting materials, other organic hole transporting materials such as aromatic silanes, aromatic silazanes and aromatic phosphine can also be used in the present invention as the B component as long as those materials have a $T_g$ greater than 75° C.:

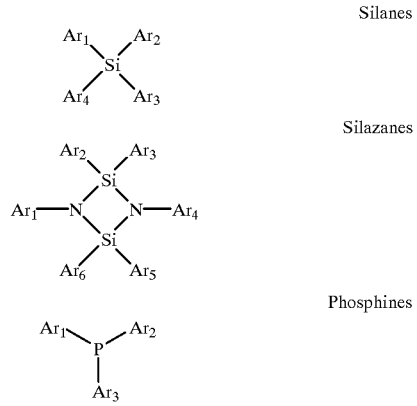

where: $Ar_1$, $Ar_2$, $Ar_3$, $Ar_4$, $Ar_5$, and $Ar_6$ are independently aromatic hydrocarbons or aromatic tertiary amine moieties. The aromatic hydrocarbons and the aromatic tertiary amine moieties in turn can be substituted. Typical substituents include alkyl groups, alkoxy groups, alkylamine groups, aryl groups, aryloxy groups, arylamine groups and halogen such as bromide, chloride, and fluoride.

Another embodiment of the present invention is directed toward the improvement of the organic EL efficiency as well as control of emission color. The purpose can be achieved by incorporation of a small fraction of a dye or pigment of high fluorescent efficiency into the whole or part of organic electroluminescent layer 18. For efficient energy transfer, it is preferred that the fluorescent dye or pigment has a bandgap no greater than that of the host material making up the organic electroluminescent medium ($A_xB_y$). It is also preferred that the fluorescent dye or pigment is present in a concentration of from $10^{-3}$ to 10 mole percent, based on the moles of the material comprised of the $A_xB_y$ medium. The selection of a fluorescent dye or pigment suitable for organic EL applications is well known to those skilled in the art and the same principles may generally be applied in the present embodiment.

Thus an organic EL device with a continuous organic electroluminescent medium without heterojunctions is obtained. The lifetime of the organic EL device is improved, by the elimination of heterojunctions in the organic electroluminescent medium and suppression of the aggregation or re-crystallization tendency of organic materials, with the formation of an organic alloy for the organic electroluminescent medium. The emission zone of the organic EL device is controlled by adjusting where in the continuous organic electroluminescent medium a fluorescent dye or pigment is incorporated. The emission efficiency as well as color of the organic EL device is controlled by the selection of the dye or pigment, and the concentration of the dye or pigment in the organic electroluminescent medium.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An organic medium for use in an electroluminescent display device comprising a layer of a continuous organic electroluminescent medium with a formula of $A_xB_y$ and having a thickness defined by a first edge and an oppositely opposed spaced apart second edge, where A is a component capable of transporting electrons, B is a component capable of transporting holes, x represents the content of the A component in the layer of organic electroluminescent medium with a value ranging from 0 adjacent the first edge of the layer of organic electroluminescent medium to 100% adjacent the second edge of the layer of organic electroluminescent medium, and y represents the content of the B component in the layer of organic electroluminescent medium with a value ranging from 0 adjacent the second edge of the layer of organic electroluminescent medium to 100% adjacent the first edge of the layer of organic electroluminescent medium.

2. An organic medium for use in an electroluminescent display device as claimed in claim 1 wherein the A component is selected from a group of organometallic complexes consisting of tris(8-quinolinol) aluminum, bis(10-oxo-benzo [h] quinoline beryllium, bis(2-(2-oxy-phenyl)benzoxazole) zinc, bis(2-(2-oxy-phenyl)benzothiazole) zinc, Bis(2-methyl-8-quinolinolato)aluminum-μ-oxo-bis(2-methyl-8-quinolinolato)aluminum, and Bis(2-methyl-8-quinolinolato) (ortho-cresolato)aluminum, or a combination of the above organometallic complexes.

3. An organic medium for use in an electroluminescent display device as claimed in claim 1 wherein the B component is selected from a group of aromatic amines having a general structure of

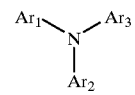

where: $Ar_1$, $Ar_2$ and $Ar_3$ are independently aromatic hydrocarbons or aromatic tertiary amine moieties, or the aromatic hydrocarbons and the aromatic tertiary amine moieties are in turn substituted with substituents selected from alkyl groups, alkoxy groups, alkylamine groups, aryl groups, aryloxy groups, arylamine groups and halogen.

4. An organic medium for use in an electroluminescent display device as claimed in claim 3 wherein the B component is selected from a group of aromatic amines having the following chemical formulas:

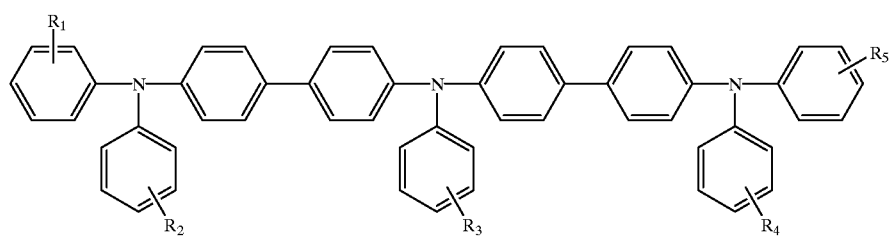
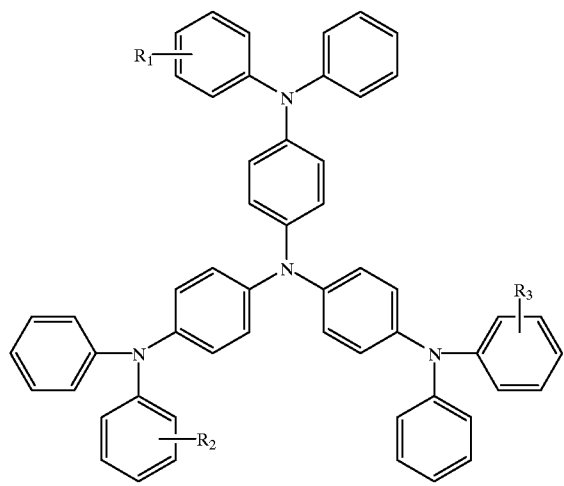
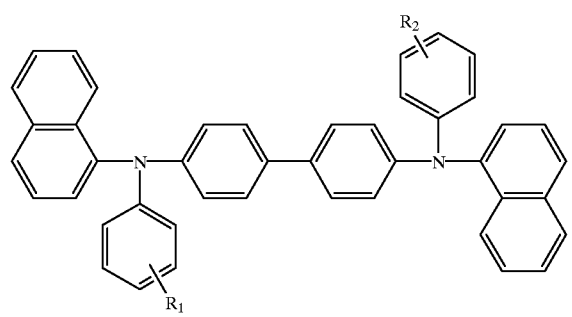
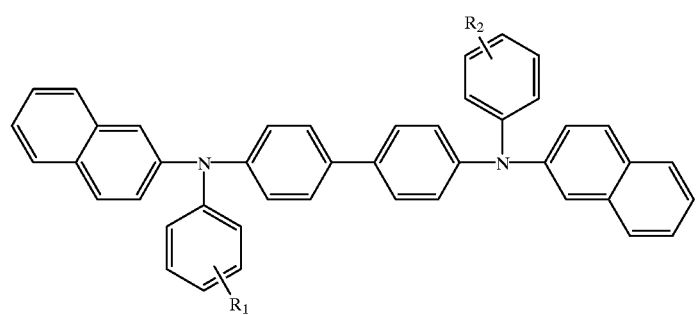

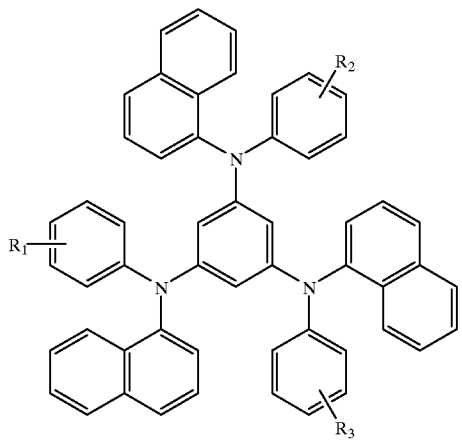

where $R_1$, $R_2$, $R_3$, $R_4$ and $R_5$ are independently selected from alkyl groups, alkoxy groups, alkylamine groups, aryl groups, aryloxy groups, arylamine groups, halogen, and a fused aromatic ring.

5. An organic medium for use in an electroluminescent display device as claimed in claim 1 wherein the B component is selected from organic aromatic silanes, aromatic silazanes and aromatic phosphine with general formulas:

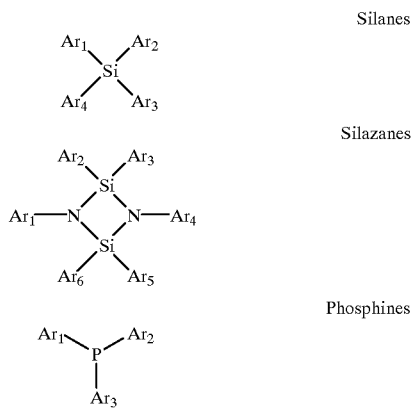

where: $Ar_1$, $Ar_2$, $Ar_3$, $Ar_4$, $Ar_5$, and $Ar_6$ are independently aromatic hydrocarbons or aromatic tertiary amine moieties or the aromatic hydrocarbons and the aromatic tertiary amine moieties are in turn substituted with substituents selected from alkyl groups, alkoxy groups, alkylamine groups, aryl groups, aryloxy groups, arylamine groups and halogen, each silane, silazane or phosphine having a $T_g$ greater than 75° C.

6. An organic medium for use in an electroluminescent display device as claimed in claim 1 including in addition at least one fluorescent dye or pigment incorporated in the layer of a continuous organic medium having a formula of $A_xB_y$.

7. An organic medium for use in an electroluminescent display device as claimed in claim 6 wherein the fluorescent dye or pigment is present in a concentration of from $10^{-3}$ to 10 mole percent, based on moles of continuous organic medium $A_xB_y$.

8. An organic medium for use in an electroluminescent display device as claimed in claim 6 wherein the organic electroluminescent medium ($A_xB_y$) has a bandgap and the fluorescent dye or pigment has a bandgap no greater than the bandgap of the organic electroluminescent medium ($A_xB_y$).

9. An organic medium for use in an electroluminescent display device comprising an organic electroluminescent layer having a thickness defined by a first side and an oppositely opposed spaced apart second side and formed of a continuous organic medium having a formula of $A_xB_y$, where A is a component capable of transporting electrons, B is a component capable of transporting holes, x represents the content of the A component in the medium, and y represents the content of the B component in the medium, where x plus y equal 100% of the continuous organic medium, and x has a value of a fraction of a percent adjacent the first side of the organic electroluminescent layer and y has a value of a fraction of a percent adjacent the second side of the organic electroluminescent layer.

10. An organic electroluminescent device comprising a cathode, an organic electroluminescent layer and an anode, laminated in sequence, wherein said organic electroluminescent layer is composed of a continuous organic medium having a formula of $A_xB_y$, where A is a component capable of transporting electrons, B is a component capable of transporting holes, x represents the content of the A component in the medium with a value ranging from 0 adjacent the anode to 100% adjacent the cathode, and y represents the content of the B component in the medium with a value ranging from 0 adjacent the cathode to 100% adjacent the anode.

11. An organic electroluminescence device as claimed in claim 10, wherein the A component in the organic electroluminescent layer is selected from a group of organometallic complexes consisting of tris(8-quinolinol) aluminum, bis (10-oxo-benzo[h] quinoline beryllium, bis(2-(2-oxy-phenyl) benzoxazole) zinc, bis(2-(2-oxy-phenyl)benzothiazole) zinc, Bis(2-methyl-8-quinolinolato)aluminum-$\mu$-oxo-bis(2-methyl-8-quinolinolato)aluminum, and Bis(2-methyl-8-quinolinolato)(ortho-cresolato)aluminum, or a combination of the above organometallic complexes.

12. An organic electroluminescence device as claimed in claim 10, wherein the B component in the organic electroluminescent layer is selected from organic tertiary aromatic amines having a general structure of

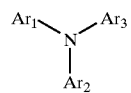

where: $Ar_1$, $Ar_2$ and $Ar_3$ are independently aromatic hydrocarbons or aromatic tertiary amine moieties, or the aromatic hydrocarbons and the aromatic tertiary amine moieties are in turn substituted with substituents selected from alkyl groups, alkoxy groups, alkylamine groups, aryl groups, aryloxy groups, arylamine groups and halogen.

13. An organic electroluminescence device as claimed in claim 10 wherein the B component in the organic electroluminescent layer is selected from organic aromatic silanes, aromatic silazanes and aromatic phosphine with general formulas:

Silanes

Silazanes

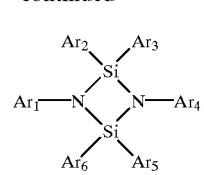

Phosphines

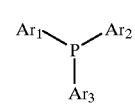

where: $Ar_1$, $Ar_2$, $Ar_3$, $Ar_4$, $Ar_5$, and $Ar_6$ are independently aromatic hydrocarbons or aromatic tertiary amine moieties, or the aromatic hydrocarbons and the aromatic tertiary amine moieties are substituted with substituents selected from alkyl groups, alkoxy groups, alkylamine groups, aryl groups, aryloxy groups, arylamine groups and halogen, each silane, silazane or phosphine having a $T_g$ greater than 75° C.

14. An organic electroluminescence device as claimed in claim 10 wherein the B component in the organic electroluminescent layer is selected from a group of aromatic amines having the following chemical formulas:

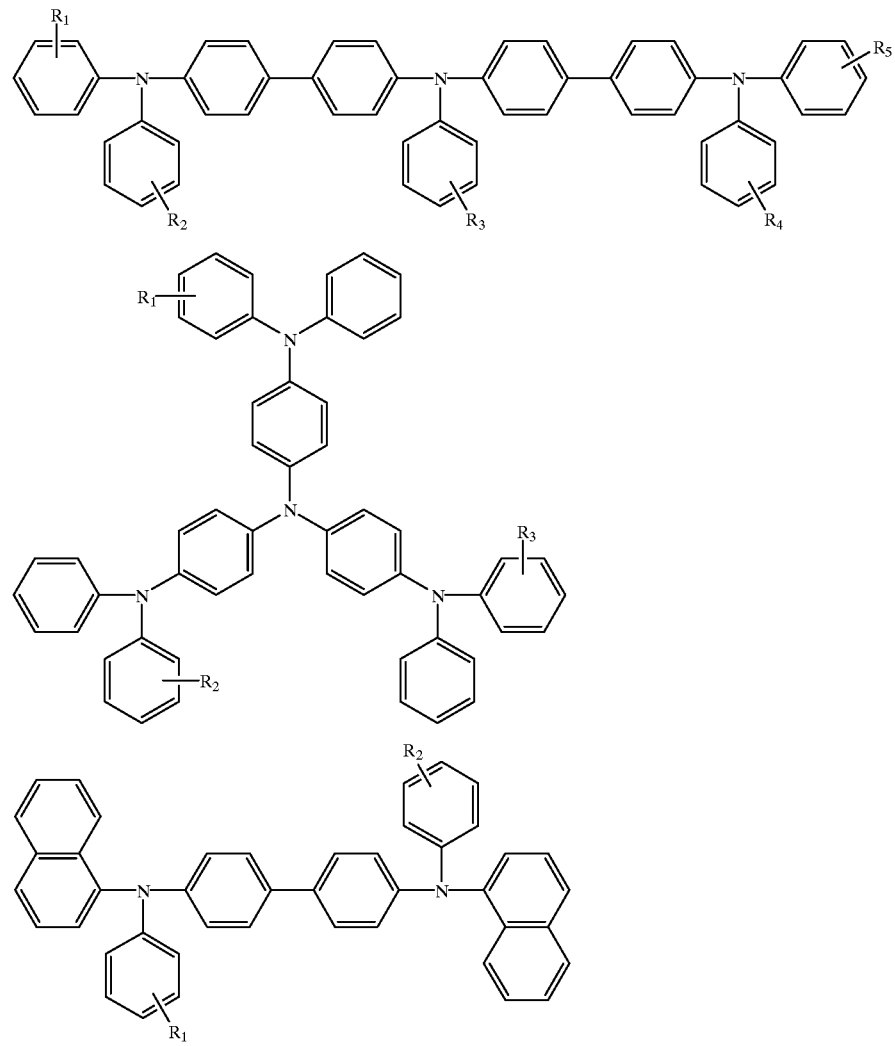

-continued

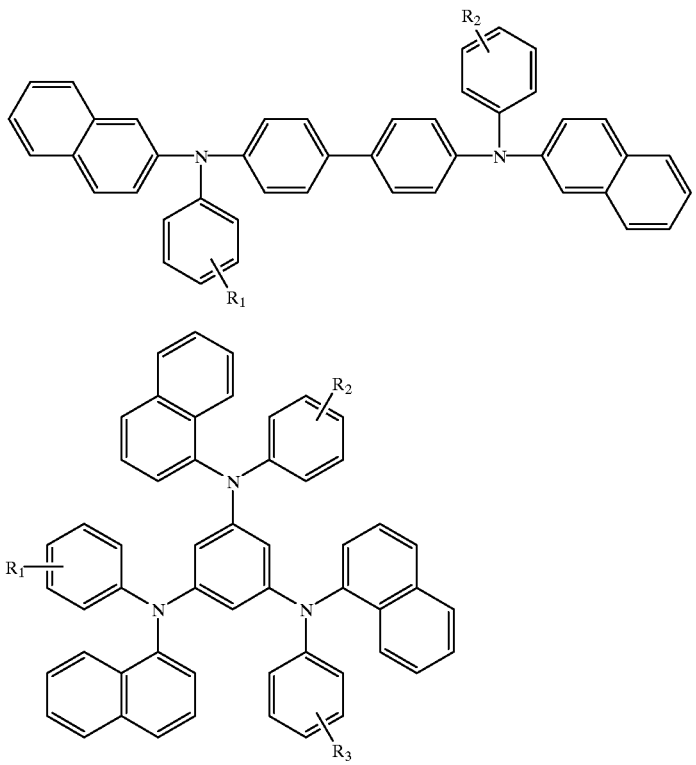

where $R_1$, $R_2$, $R_3$, $R_4$ and $R_5$ are independently selected from alkyl groups, alkoxy groups, alkylamine groups, aryl groups, aryloxy groups, arylamine groups, halogen, and a fused aromatic ring.

15. An organic electroluminescence device as claimed in claim 10 including at least one fluorescent dye or pigment incorporated in the continuous organic medium $A_xB_y$ of the organic electroluminescent layer, the fluorescent dye or pigment being present in a concentration of from $10^{-3}$ to 10 mole percent based on moles of the organic electroluminescent medium ($A_xB_y$), and the organic electroluminescent medium ($A_xB_y$) having a bandgap and the fluorescent dye or pigment having a bandgap no greater than the bandgap of the organic electroluminescent medium ($A_xB_y$).

16. An organic electroluminescent device comprising a cathode, an organic electroluminescent layer and an anode, laminated in sequence, wherein said organic electroluminescent layer is composed of a layer of a continuous organic medium having a formula of $A_xB_y$, where A is a component capable of transporting electrons, B is a component capable of transporting holes, x represents the content of the A component in the medium with a value ranging from 0 adjacent the anode to 100% adjacent the cathode, and y represents the content of B component in the medium with a value ranging from 0 adjacent the cathode to 100% adjacent the anode, and at least one fluorescent dye or pigment incorporated in the layer of organic electroluminescent medium.

17. An organic electroluminescence device as claimed in claim 16 wherein the fluorescent dye or pigment is present in a concentration of from $10^{-3}$ to 10 mole percent, based on moles of the organic electroluminescent medium $A_xB_y$.

18. An organic electroluminescence device as claimed in claim 16 wherein the organic electroluminescent medium ($A_xB_y$) has a bandgap and the fluorescent dye or pigment has a bandgap no greater than the bandgap of the organic electroluminescent medium ($A_xB_y$).

19. An organic electroluminescent device comprising a cathode, an organic electroluminescent layer and an anode, laminated in sequence, said organic electroluminescent layer having a thickness defined by a first side and an oppositely opposed spaced apart second side and being formed of a continuous organic medium having a formula of $A_xB_y$, where A is a component capable of transporting electrons, B is a component capable of transporting holes, x represents the content of the A component in the medium, and y represents the content of the B component in the medium and where x plus y equal 100% of the continuous organic medium, and x has a value of a fraction of a percent adjacent the first side of the organic electroluminescent layer and y has a value of a fraction of a percent adjacent the second side of the organic electroluminescent layer.

* * * * *